United States Patent
Yang

(10) Patent No.: US 10,903,362 B2
(45) Date of Patent: Jan. 26, 2021

(54) SEMICONDUCTOR DEVICE WITH ASYMMETRIC STRAINED SOURCE/DRAIN STRUCTURE AND FABRICATION METHOD

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/260,158

(22) Filed: Jan. 29, 2019

(65) Prior Publication Data
US 2020/0227554 A1    Jul. 16, 2020

(30) Foreign Application Priority Data
Jan. 14, 2019    (CN) .......................... 2019 1 0030933

(51) Int. Cl.
| | | |
|---|---|---|
| H01L 29/78 | (2006.01) | |
| H01L 29/66 | (2006.01) | |
| H01L 29/08 | (2006.01) | |
| H01L 21/033 | (2006.01) | |
| H01L 21/324 | (2006.01) | |
| H01L 21/225 | (2006.01) | |
| H01L 21/306 | (2006.01) | |
| H01L 29/10 | (2006.01) | |

(52) U.S. Cl.
CPC ...... *H01L 29/7835* (2013.01); *H01L 21/0337* (2013.01); *H01L 21/2253* (2013.01); *H01L 21/306* (2013.01); *H01L 21/324* (2013.01); *H01L 29/0847* (2013.01); *H01L 29/1033* (2013.01); *H01L 29/66659* (2013.01); *H01L 29/7834* (2013.01)

(58) Field of Classification Search
CPC ............. H01L 29/7835; H01L 29/0847; H01L 29/1033; H01L 29/66659; H01L 29/7834; H01L 21/0337; H01L 21/2253; H01L 21/306; H01L 21/324
USPC ........................................................ 257/336
See application file for complete search history.

(56) References Cited

U.S. PATENT DOCUMENTS

| | | | |
|---|---|---|---|
| 9,899,523 B2 | 2/2018 | Shen | |
| 2006/0258072 A1 | 11/2006 | Kavalieros | |
| 2012/0061736 A1 | 3/2012 | Yin | |
| 2012/0104473 A1* | 5/2012 | Yin | ..................... H01L 29/7848 257/288 |
| 2012/0104474 A1 | 5/2012 | Yin | |
| 2013/0256664 A1 | 10/2013 | Qin | |
| 2013/0309829 A1 | 11/2013 | Fang | |
| 2013/0323893 A1 | 12/2013 | Chuang | |
| 2016/0049511 A1 | 2/2016 | Kim | |
| 2016/0163797 A1* | 6/2016 | Shen | ................. H01L 29/66795 257/401 |

\* cited by examiner

*Primary Examiner* — Tu-Tu V Ho
(74) *Attorney, Agent, or Firm* — Winston Hsu

(57) ABSTRACT

A semiconductor device includes a substrate having an upper surface; a source region in the substrate; a drain region in the substrate and spaced apart from the source region; a channel region between the source region and the drain region; a gate structure on the channel region; m dislocations in the source region, wherein m is an integer greater than or equal to 1; and n dislocations in the drain region, wherein n is an integer greater than or equal to 0, and wherein m is greater than n.

6 Claims, 11 Drawing Sheets

SEMICONDUCTOR DEVICE WITH ASYMMETRIC STRAINED SOURCE/DRAIN STRUCTURE AND FABRICATION METHOD

BACKGROUND OF THE INVENTION

1. Field of the Invention

The present invention relates to the field of semiconductor process technology, and more particularly to a field effect transistor having an asymmetric strained source/drain structure and a fabrication method thereof.

2. Description of the Prior Art

As the size of semiconductor components continues to shrink, in order to take into account device performance, there may be a design trade-off between, for example, drive current and junction leakage. For example, in a field effect transistor (FET) device, the source side characteristic is that a small approximation yields a higher drive current due to higher stress, and the drain side characteristic is that a smaller approximation causes a higher junction leakage.

In addition, semiconductor components such as FET devices typically use a vertical implant process to construct doped regions in the substrate. Therefore, the conventional device typically has a symmetrical source/drain (S/D) structure in the substrate. It is a design challenge to optimize both the drive current and the junction leakage.

SUMMARY OF THE INVENTION

The invention provides an improved semiconductor structure and a manufacturing method thereof, which can simultaneously optimize characteristics including driving current and junction leakage of a field effect transistor device, thereby improving device performance.

One aspect of the invention provides a method of forming a semiconductor structure. First, a substrate is provided, including an upper surface. A gate structure is disposed on the upper surface. A spacer is disposed on a sidewall of the gate structure. A first region (e.g., a source region) is located in the substrate. A second region (e.g., a drain region) is located in the substrate. The first region and the second region are dry etched to form a first trench and a second trench, respectively. The second region is masked. The first region is then wet etched through the first trench to form a widened first trench. A stress-inducing layer is then formed in the widened first trench and in the second trench.

According to another embodiment of the present invention, a method of forming a semiconductor structure includes: providing a substrate including an upper surface, a gate structure disposed on the upper surface, a spacer disposed on a sidewall of the gate structure, a first region in the substrate, and a second region in the substrate; masking the second region and amorphizing the first region, such that an amorphous layer is formed in the first region; depositing a stress layer on the substrate, wherein the stress layer conformally covers the gate structure, the spacer, the first region and the second region; and recrystallizing the amorphous layer, thereby forming a dislocation in the first region.

Another aspect of the invention provides a semiconductor structure comprising: a substrate having an upper surface; a first region located in the substrate; a second region located in the substrate and spaced apart from the first region; a channel region between the first region and the second region; a gate structure located on the channel region; m dislocations located in the first region, wherein m is an integer greater than or equal to 1; and n dislocations located in the second region, wherein n is an integer greater than or equal to 0, and wherein m is greater than n.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

The invention discloses an improved field effect transistor (FET) device and a manufacturing method thereof, which can simultaneously optimize the driving current and the junction leakage of the FET device and improve the device performance.

Figure 1:
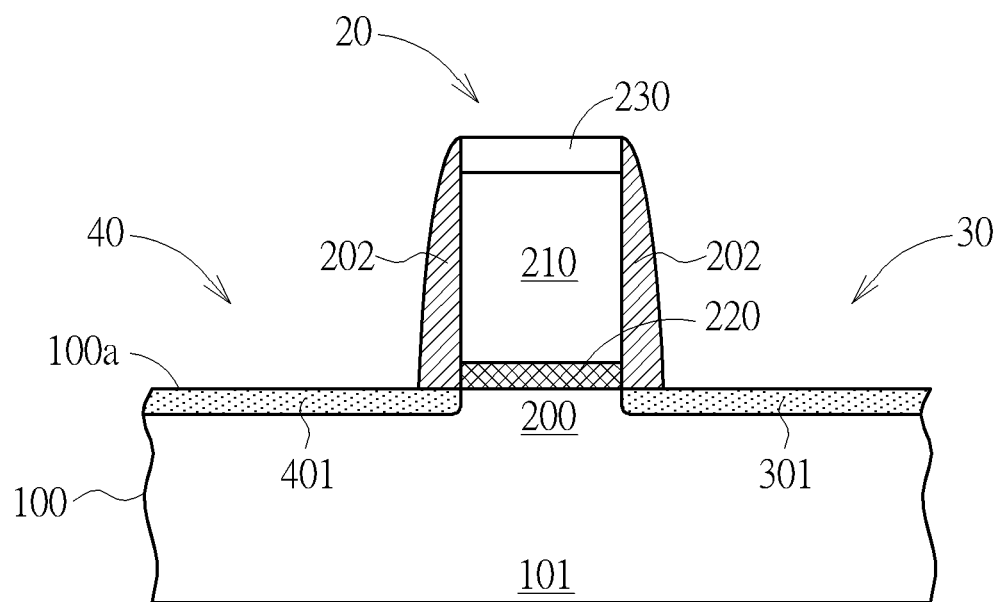
FIG. 1 to FIG. 4 are cross-sectional views showing a method of fabricating a PMOS transistor structure 1 according to an embodiment of the invention.

Please refer to FIG. 1 to FIG. 4, which are cross-sectional views showing a method of fabricating a PMOS transistor structure 1 according to an embodiment of the invention. As shown in FIG. 1, first, a substrate 100, for example, a P-type silicon substrate is provided, but is not limited thereto. An N-type well 101 may be formed in the substrate 100. The substrate 100 includes an upper surface 100a. According to an embodiment of the present invention, a gate structure 20 is formed on the upper surface 100a. For example, the gate structure 20 comprises a polysilicon layer 210, a gate dielectric layer 220, and a silicon nitride cap layer 230, but is not limited thereto. A spacer 202, such as a silicon nitride spacer, may be provided on each sidewall of the gate structure 20, but is not limited thereto.

In addition, a first region 30 and a second region 40 are respectively disposed in the substrate 100 on opposite sides of the gate structure 20. The first region 30 and the second region 40 are separated from each other and do not overlap each other. A channel region 200 is formed between the first region 30 and a second region 40. According to an embodiment of the invention, the first region 30 serves as the source region of the field effect transistor device and the second region 40 serves as the drain region of the field effect transistor device.

According to an embodiment of the invention, a lightly doped drain (LDD) region 301 and an LDD region 401 are respectively disposed in the first region 30 and the second region 40. The LDD region 301 and the LDD region 401 are disposed in the N-well 101. For example, the LDD region 301 and the LDD region 401 may be P-type LDD regions.

Figure 2:
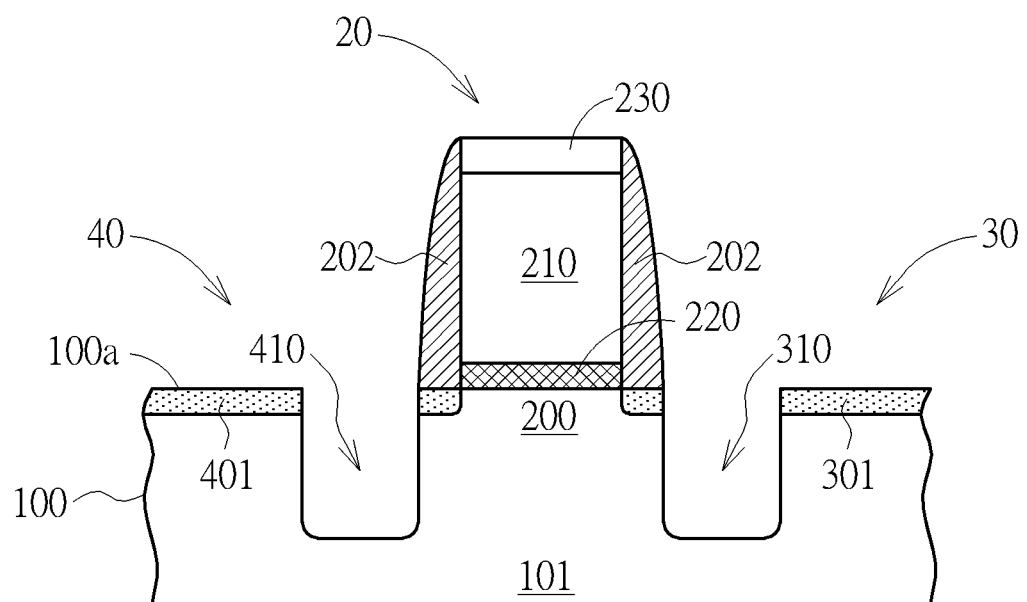

As shown in FIG. 2, a dry etching process, for example, an anisotropic dry etching process or a reactive ion dry etching process, etc., is performed to etch the substrate 100 of the first region 30 and the second region 40, and etch through the LDD region 301 and the LDD region 401, thereby forming a first trench 310 and a second trench 410, respectively.

Figure 3:
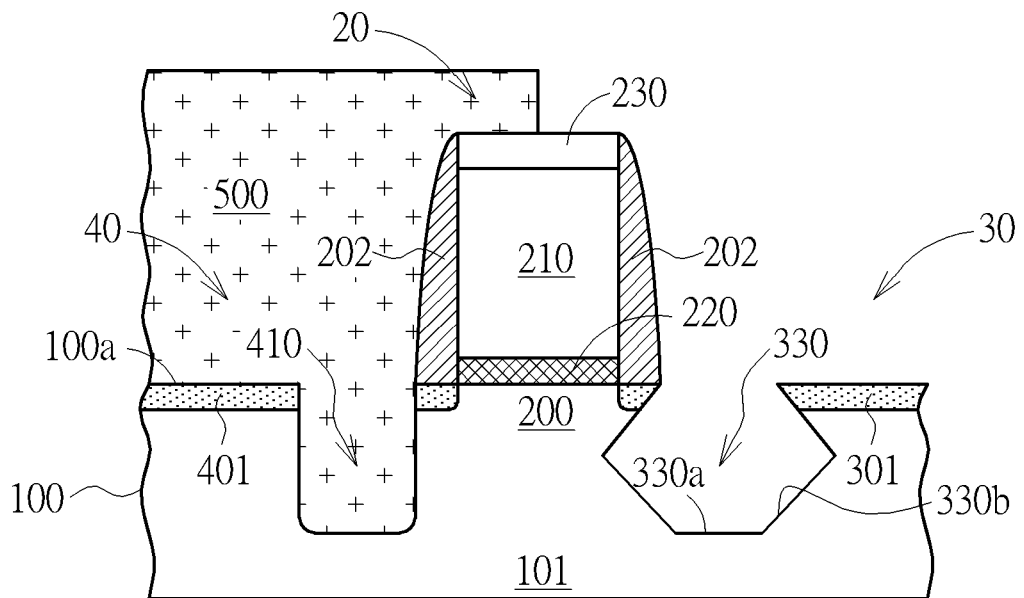

As shown in FIG. 3, the second region 40 is then masked. For example, a mask layer 500, such as a silicon nitride layer, is blanket deposited on the substrate 100, wherein the mask layer 500 covers the gate structure 20, the spacers 202, the first region 30, and the second region 40. Next, a portion of the mask layer 500 is removed using a lithography and etching processes to reveal the first region 30. The remaining mask layer 500 covers the second region 40, the spacers 202 adjacent the second region 40, and portions of the gate structure 20.

Subsequently, a wet etching process is performed to wet etch the first region 30 via the first trench 310 to form a widened first trench 330. The wet etching process described above may involve the use of hydroxyl (OH) containing materials including, but not limited to, potassium hydroxide, tetramethylammonium hydroxide (TMAH) or sodium hydroxide. According to an embodiment of the invention, the widened first trench 330 may have a hexagonal cross-sectional profile. According to an embodiment of the invention, the widened first trench 330 may have a bottom surface 330a and a sidewall 330b. For example, the bottom surface 330a and the sidewall 330b may be a silicon surface of a <111> crystal orientation.

At this point, the widened first trench 330 formed in the first region 30 slightly extends toward the region directly under the gate structure 20 (i.e. the channel region 200). Since the second trench 410 in the second region 40 is not wet etched, there is no such structure.

Figure 4:
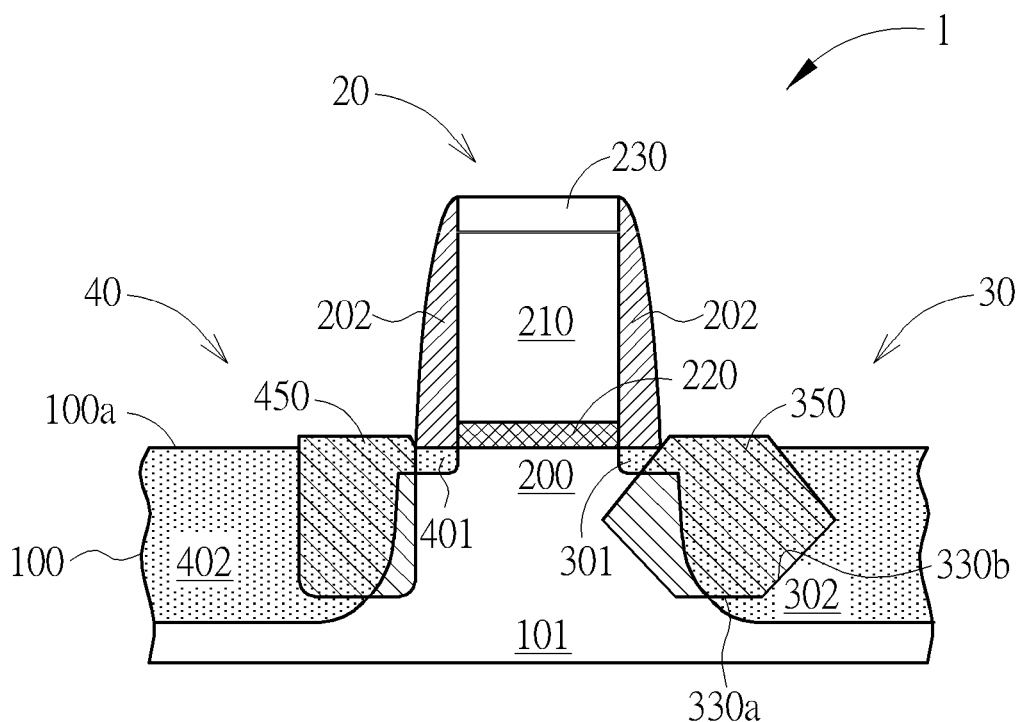

Next, as shown in FIG. 4, after the first region 30 is wet-etched, the remaining mask layer 500 is removed, revealing the first region 30 and the second region 40. Then, a stress-inducing layer 350 and a stress-inducing layer 450, for example, a silicon germanium (SiGe) layer, are formed in the widened first trench 330 and the second trench 410, respectively. According to an embodiment of the present invention, the stress-inducing layers 350, 450 may be formed using a selective epitaxial method, but are not limited thereto. Subsequently, ion implantation for forming heavily doped source and the drain may be performed to form a source heavily doped region 302 in the first region 30 and a drain heavily doped region 402 in the second region 40. For example, the source heavily doped region 302 and the drain heavily doped region 402 can be P-type heavily doped regions.

As can be seen from FIG. 4, the volume of the stress-inducing layer 350 in the first region 30 is larger than the volume of the stress-inducing layer 450 in the second region 40, and the stress-inducing layer 350 is closer to the channel region 200 directly below the gate structure 20, thereby forming an asymmetric strained source/drain structure, which enables the source stress-inducing layer 350 to be closer to the channel region 200 of the PMOS transistor structure 1, and can induce greater stress in the channel region 200, thereby enhancing the drive current of the PMOS transistor structure 1.

On the other hand, the stress-inducing layer 450 of the second region 40 can reduce the junction leakage of the drain terminal due to its smaller volume and larger distance between the stress-inducing layer 450 and the channel region 200. Therefore, the present invention field effect transistor with an asymmetric strained source/drain structure can optimize both the drive current and the junction leakage.

FIG. 5 to FIG. 11 are cross-sectional views showing a method of fabricating an NMOS transistor structure 2 according to another embodiment of the present invention, wherein the same or similar elements, structures, or material layers are designated by similar numeral numbers.

Figure 5:
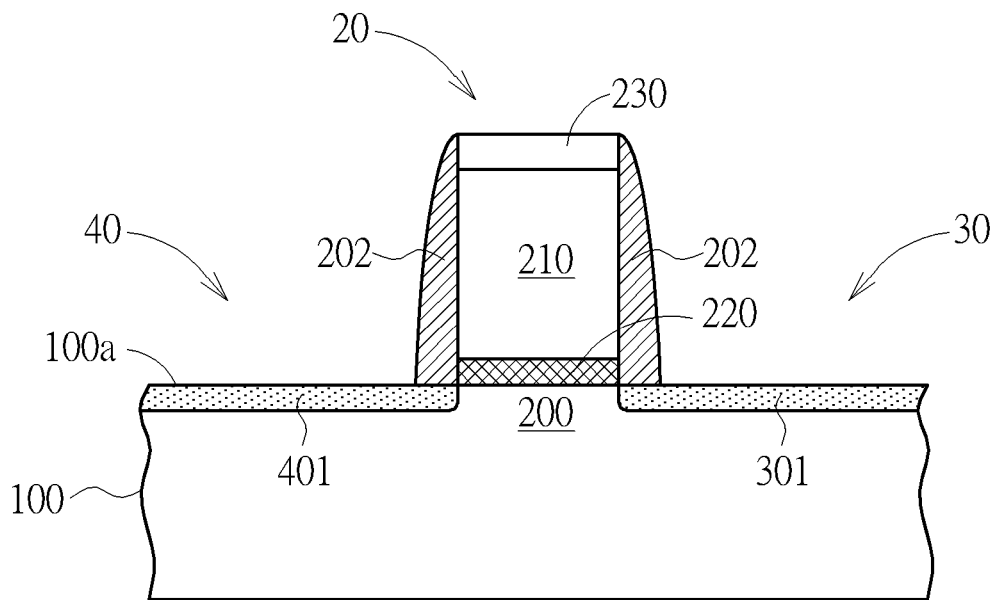
FIG. 5 to FIG. 11 are cross-sectional views showing a method of fabricating an NMOS transistor structure according to another embodiment of the present invention.

As shown in FIG. 5, first, a substrate 100, for example, a P-type silicon substrate is provided, but is not limited thereto. The substrate 100 includes an upper surface 100a. According to an embodiment of the present invention, a gate structure 20 is formed on the upper surface 100a. For example, the gate structure 20 comprises a polysilicon layer 210, a gate dielectric layer 220, and a silicon nitride cap layer 230, but is not limited thereto. A spacer 202, such as a silicon nitride spacer, may be provided on each sidewall of the gate structure 20, but is not limited thereto.

In addition, a first region 30 and a second region 40 are respectively disposed in the substrate 100 on opposite sides of the gate structure 20. The first region 30 and the second region 40 are separated from each other and do not overlap each other. According to an embodiment of the invention, the first region 30 serves as the source region of the field effect transistor device and the second region 40 serves as the drain region of the field effect transistor device.

According to an embodiment of the invention, an LDD region 301 and an LDD region 401 are respectively disposed in the first region 30 and the second region 40. For example, the LDD region 301 and the LDD region 401 may be N-type LDD regions.

Figure 6:
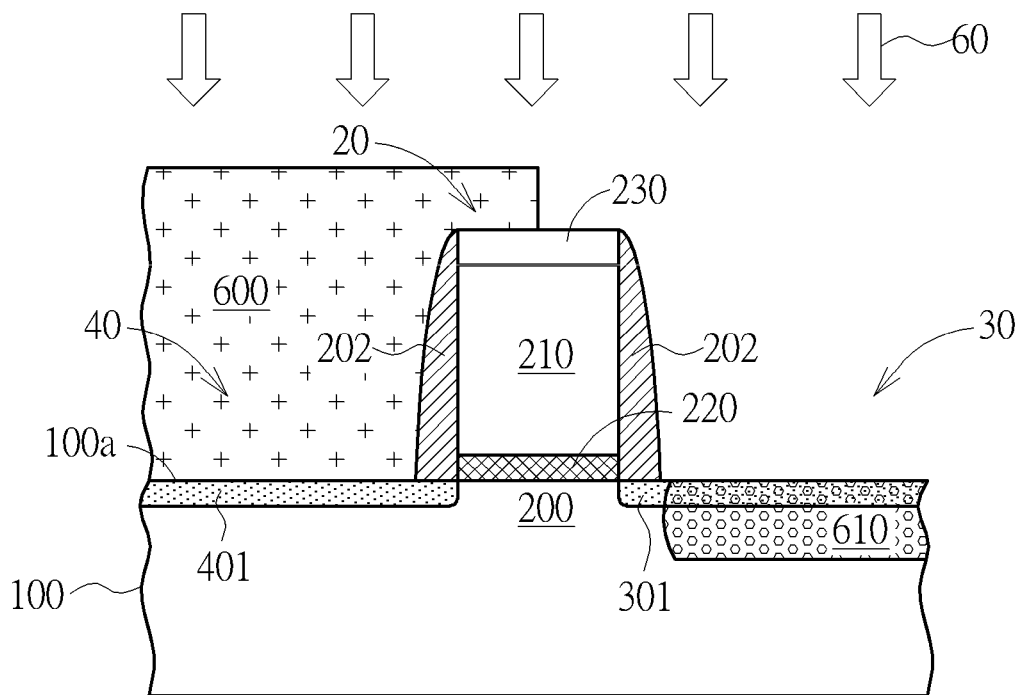

As shown in FIG. 6, next, the second region 40 is masked. For example, the second region 40 is completely covered by a photoresist pattern 600. The photoresist pattern 600 may only cover the second region 40, the spacers 202 adjacent to the second region 40, and portions of the gate structure 20. Then, an ion implantation process 60 is performed to implant dopants, for example, silicon (Si), germanium (Ge) or xenon (Xe) ions into the substrate 100 in the first region 30 to amorphize the first region 30, thereby forming an amorphous silicon layer 610 only in the first region 30.

Figure 7:
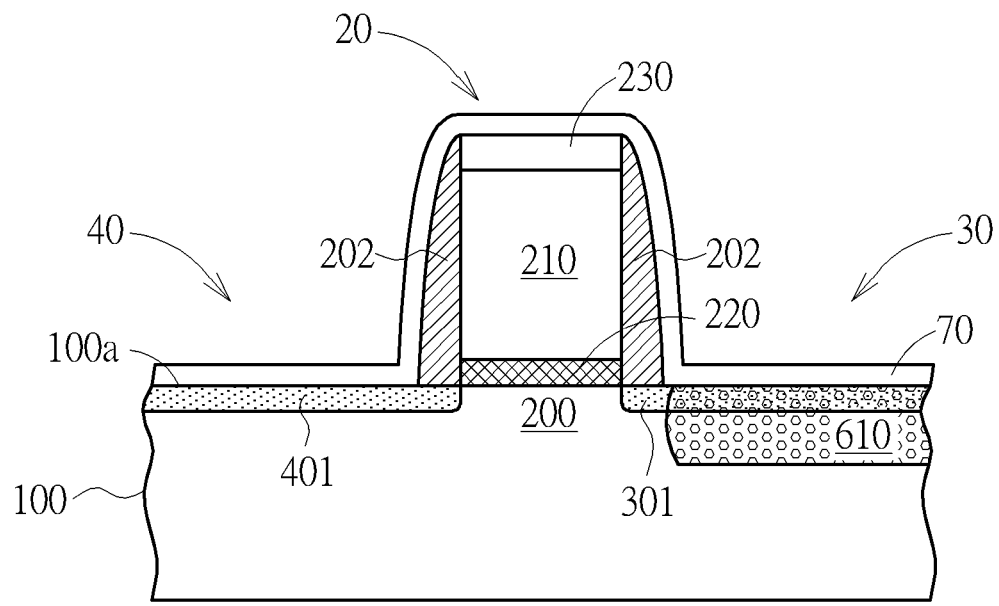
Figure 8:
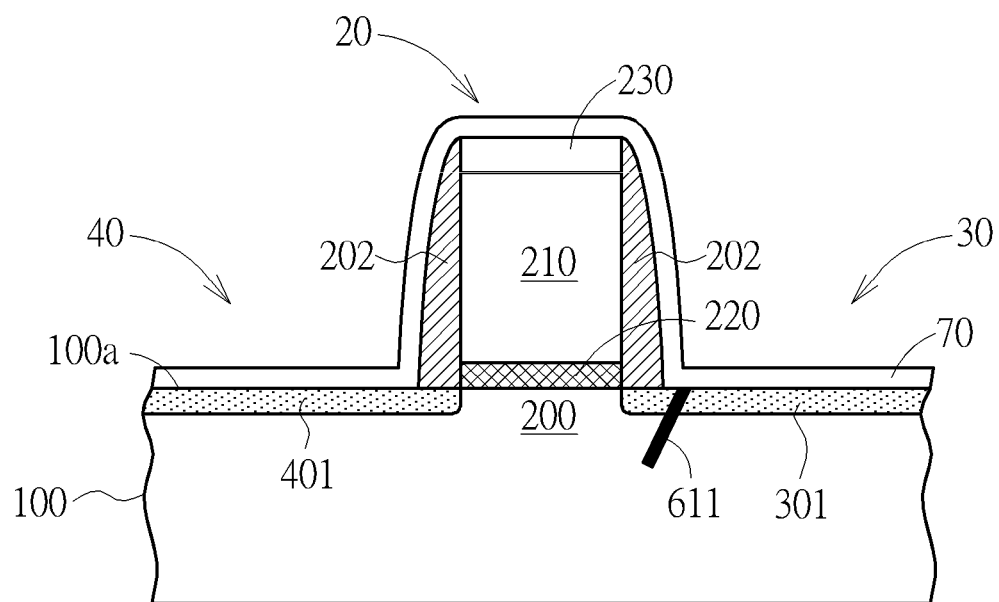

As shown in FIG. 7 and FIG. 8, a stress memorization technique (SMT) process is performed. For example, a stress film 70 is deposited on the substrate 100. The stress film 70 conformally covers the gate structure 20, the spacers 202, the first region 30, the amorphous silicon layer 610 in the first region 30, and the second region 40. According to an embodiment of the present invention, the stress film 70 may include a silicon nitride layer, a silicon oxide layer, or a silicon oxynitride layer, but is not limited thereto. According to an embodiment of the invention, the stress film 70 may have a tensile stress.

Subsequently, an annealing process is performed to recrystallize the amorphous layer 610, so that a dislocation 611 is formed only in the first region 30, as shown in FIG.

8. According to an embodiment of the present invention, the annealing process may be a two-step annealing process. For example, the temperature of the first-stage annealing is between 400 and 750° C., and the temperature of the second-stage annealing is greater than 900° C.

Figure 9:
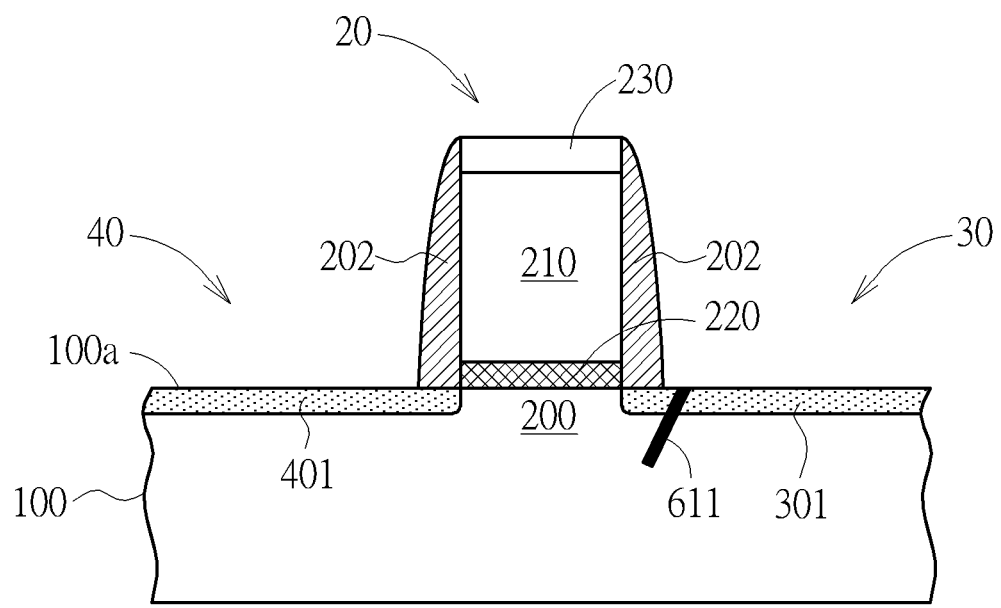

As shown in FIG. 9, the stress film 70 is then removed to reveal the second region 40. At this point, the dislocation 611 formed in the first region 30 can provide an appropriate tensile stress to the channel region 200, thereby forming a strained source structure.

Figure 10:
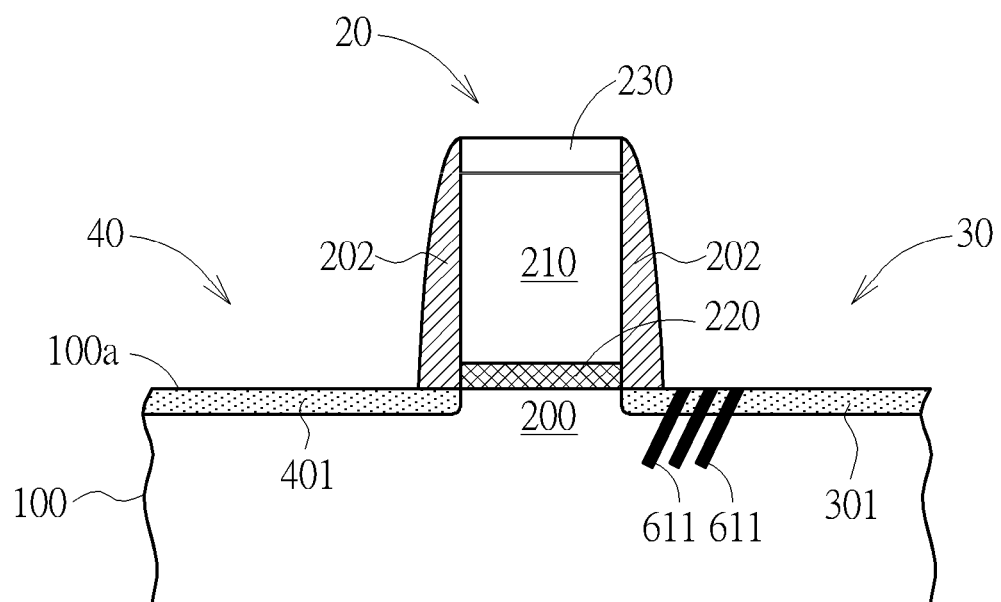
Figure 11:
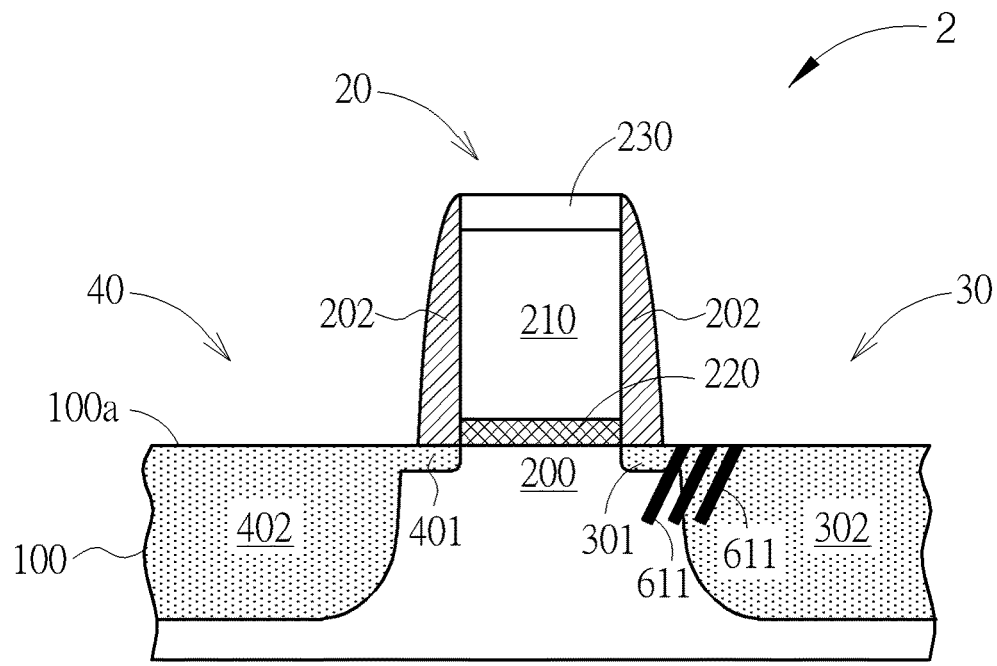

Moreover, in accordance with another embodiment of the present invention, the steps depicted through FIGS. 6-9 can be repeated such that a plurality of dislocations 611 are formed in the first region 30, as shown in FIG. 10, to increase the source tensile stress. Finally, ion implantation for forming heavily doped source and the drain may be performed to form a source heavily doped region 302 in the first region 30 and a drain heavily doped region 402 in the second region 40. For example, the source heavily doped region 302 and the drain heavily doped region 402 may be N-type heavily doped regions, thus forming an NMOS field effect transistor 2 having an asymmetric strained source/drain structure, as shown in FIG. 11.

Figure 12:
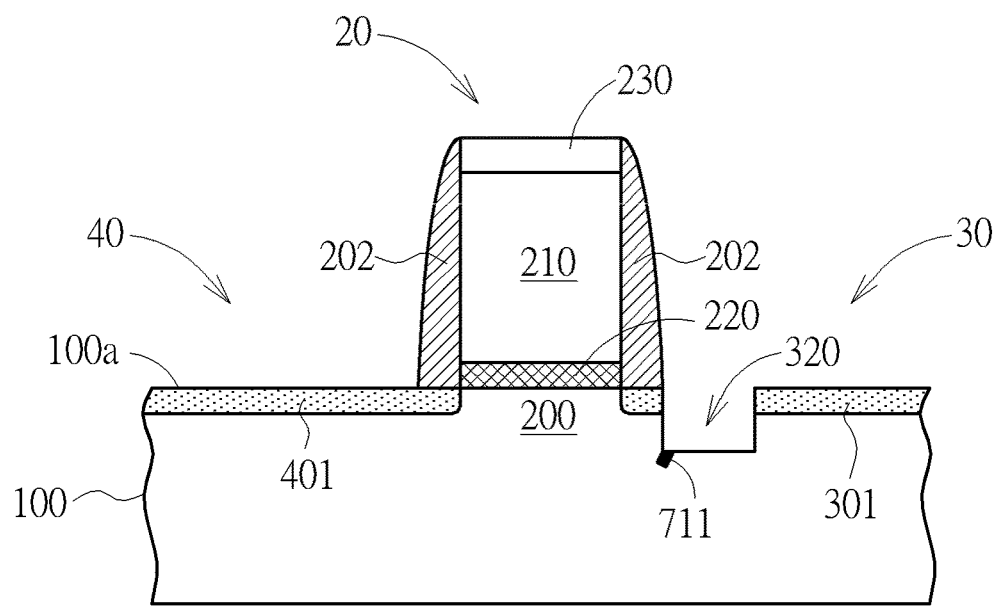
FIG. 12 to FIG. 13 are schematic cross-sectional views showing a method for fabricating an NMOS transistor structure according to still another embodiment of the present invention.
Figure 13:
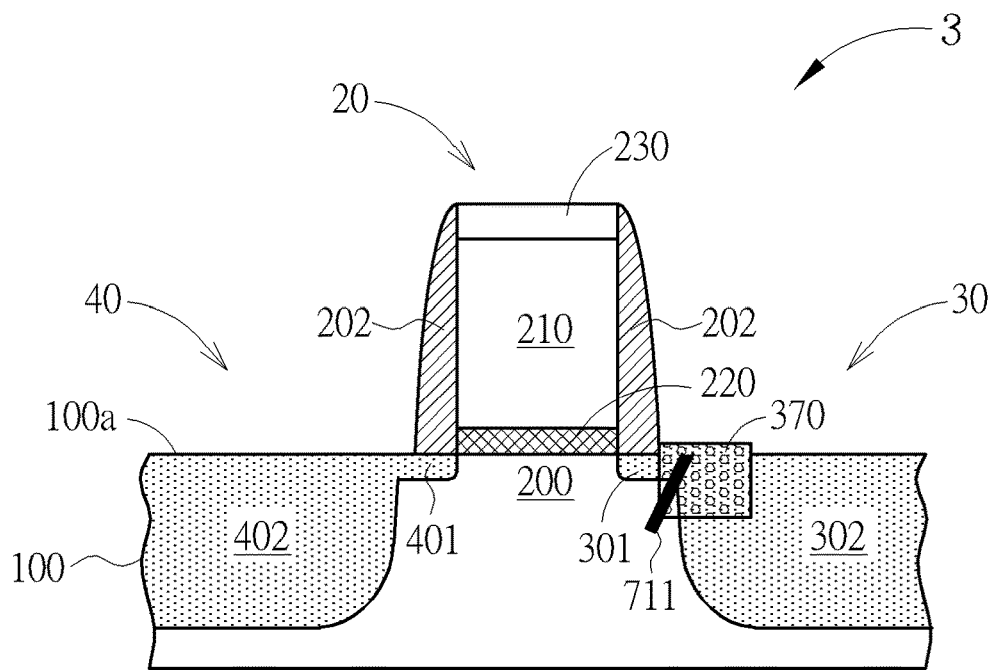

Please refer to FIG. 12 to FIG. 13, which are schematic cross-sectional views showing a method for fabricating an NMOS transistor structure 3 according to still another embodiment of the present invention, in which the same or similar elements, structures or material layers are designated by the same numeral numbers. To simplify the description, the steps of FIG. 12 are performed after the steps of FIG. 9.

As shown in FIG. 12, after the stress film 70 is removed, a trench 320 may be formed in the first region 30. The trench 320 may be a trench formed by an isotropic dry etch and may be adjacent to the spacer 202 (or aligned with the outer sidewall of the spacer 202). The upper portion of the dislocation 611 in the first region 30 is etched away, but the lower portion of the dislocation 611 remains at the bottom of the first trench 320.

As shown in FIG. 13, a stress-inducing layer 370, such as a silicon phosphide (SiP) epitaxial layer or a silicon carbide (SiC) epitaxial layer, is then formed in the trench 320. According to an embodiment of the present invention, the stress-inducing layer 370 may be formed using a selective epitaxial method, but is not limited thereto. According to an embodiment of the present invention, when the stress-inducing layer 370 is grown, a dislocation 711 is formed in the stress-inducing layer 370.

Finally, ion implantation for forming heavily doped source and the drain may be performed to form a source heavily doped region 302 in the first region 30 and a drain heavily doped region 402 in the second region 40. For example, the source heavily doped region 302 and the drain heavily doped region 402 may be N-type heavily doped regions, thus forming an NMOS field effect transistor 3 having an asymmetric strained source/drain structure.

Figure 14:
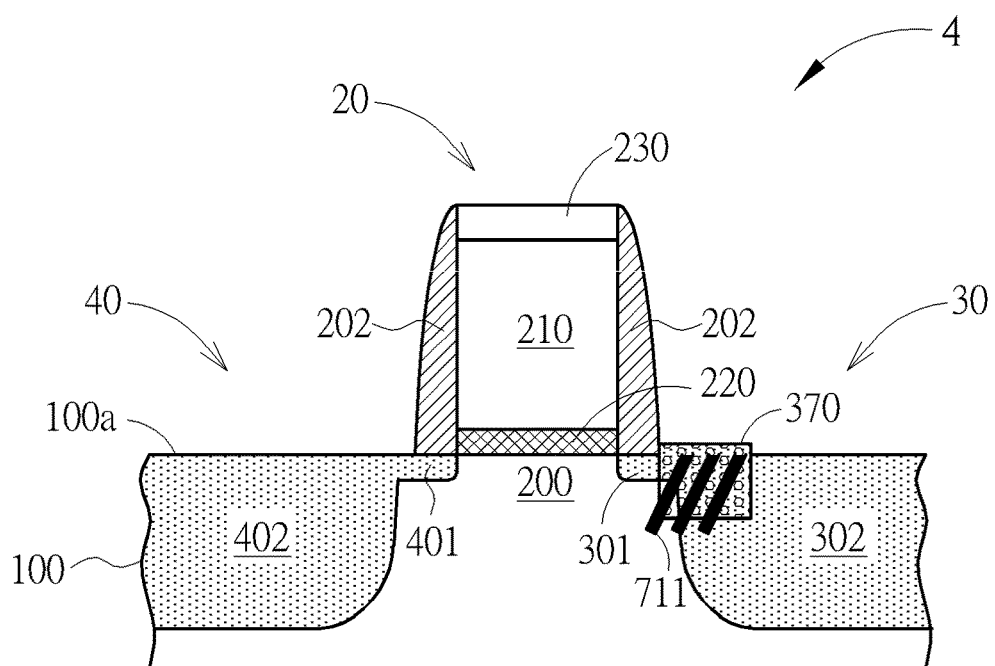
FIG. 14 and FIG. 15 show variations in the structure of an NMOS transistor in some other embodiments of the present invention.
Figure 15:
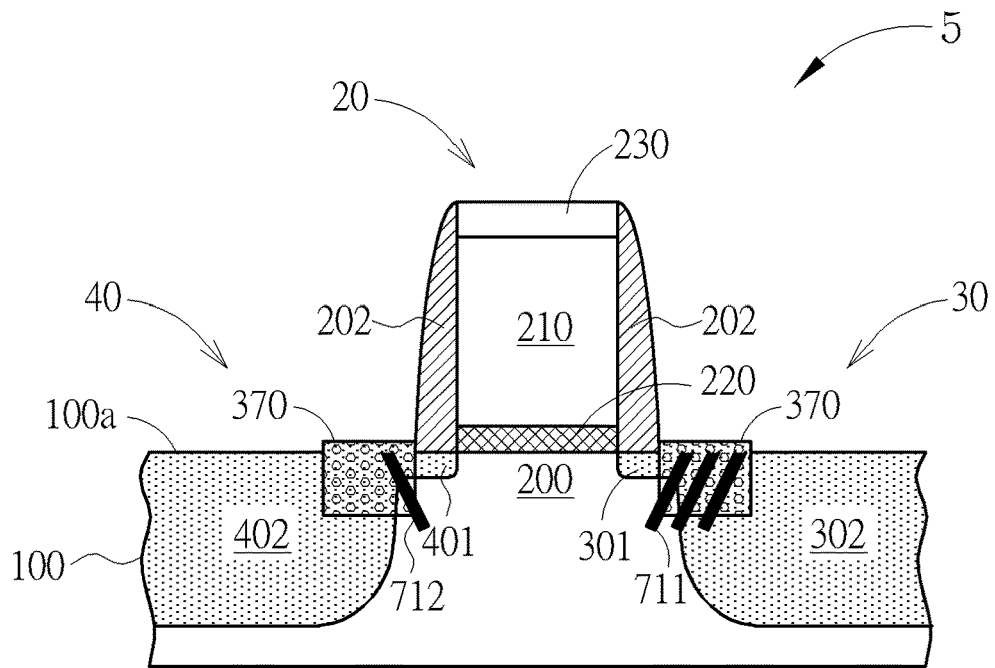

Please refer to FIG. 14 and FIG. 15. FIG. 14 and FIG. 15 show variations in the structure of an NMOS transistor in some other embodiments of the present invention.

FIG. 14 differs from FIG. 13 in that the NMOS transistor structure 4 of FIG. 14 has a plurality of dislocations 711 in its first region 30.

FIG. 15 differs from FIG. 14 in that the NMOS transistor structure 5 of FIG. 15 may also be formed with a stress-inducing layer 370 in its second region 40, and the stress-inducing layer 370 in the second region 40 may also be formed with dislocation 712, wherein the number of the dislocations 712 of the stress-inducing layer 370 in the second region 40 is less than the number of the dislocations 711 of the stress-inducing layer 370 in the first region 30.

According to an embodiment of the present invention, as shown in FIG. 15, the NMOS transistor structure 5 includes a substrate 100 having an upper surface 100a, a first region 30 disposed in the substrate 100, a second region 40 disposed in the substrate 100 and spaced apart from the first region 30, a channel region 200 between the first region 30 and the second region 40, and a gate structure 20 on the channel region 200. There may be m dislocations 711 in the first region 30, where m is an integer greater than or equal to 1, and there may be n dislocations 712 in the second region 40, where n is an integer greater than or equal to 0, and wherein m is greater than n, such as m=3, n=1. The first region 30 and the second region 40 are both N-type doped regions. The second region 40 further includes a stress-inducing layer 370, and the n dislocations 712 are disposed in the stress-inducing layer 370. The stress-inducing layer 370 includes a silicon phosphide layer or a silicon carbide layer.

FIG. 16 to FIG. 21 are cross-sectional views showing a method of fabricating an NMOS transistor structure 6 according to still another embodiment of the present invention, in which the same or similar elements, structures or material layers are designated by the same numeral numbers.

Figure 16:
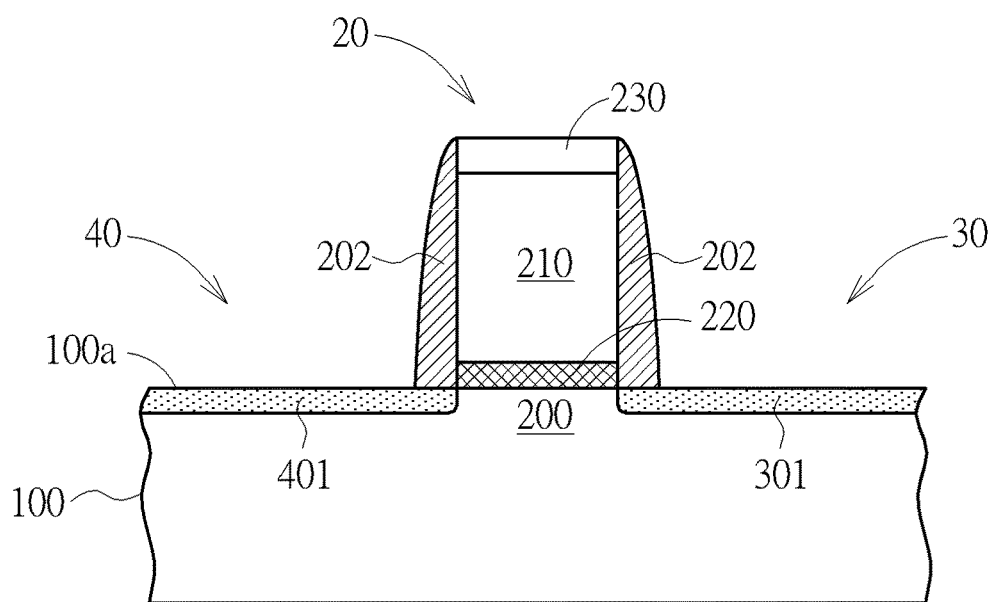
FIG. 16 to FIG. 21 are cross-sectional views showing a method of fabricating an NMOS transistor structure 6 according to still another embodiment of the present invention.

As shown in FIG. 16, first, a substrate 100, for example, a P-type silicon substrate is also provided, but is not limited thereto. The substrate 100 includes an upper surface 100a. According to an embodiment of the present invention, a gate structure 20 is formed on the upper surface 100a. For example, the gate structure 20 comprises a polysilicon layer 210, a gate dielectric layer 220, and a silicon nitride cap layer 230, but is not limited thereto. A spacer 202, such as a silicon nitride spacer, may be provided on each sidewall of the gate structure 20, but is not limited thereto.

In addition, a first region 30 and a second region 40 are respectively disposed in the substrate 100 on opposite sides of the gate structure 20. The first region 30 and the second region 40 are separated from each other and do not overlap each other. According to an embodiment of the invention, the first region 30 serves as the source region of the field effect transistor device and the second region 40 serves as the drain region of the field effect transistor device.

According to an embodiment of the invention, an LDD region 301 and an LDD region 401 are respectively disposed in the first region 30 and the second region 40. For example, the LDD region 301 and the LDD region 401 may be N-type LDD regions.

Figure 17:
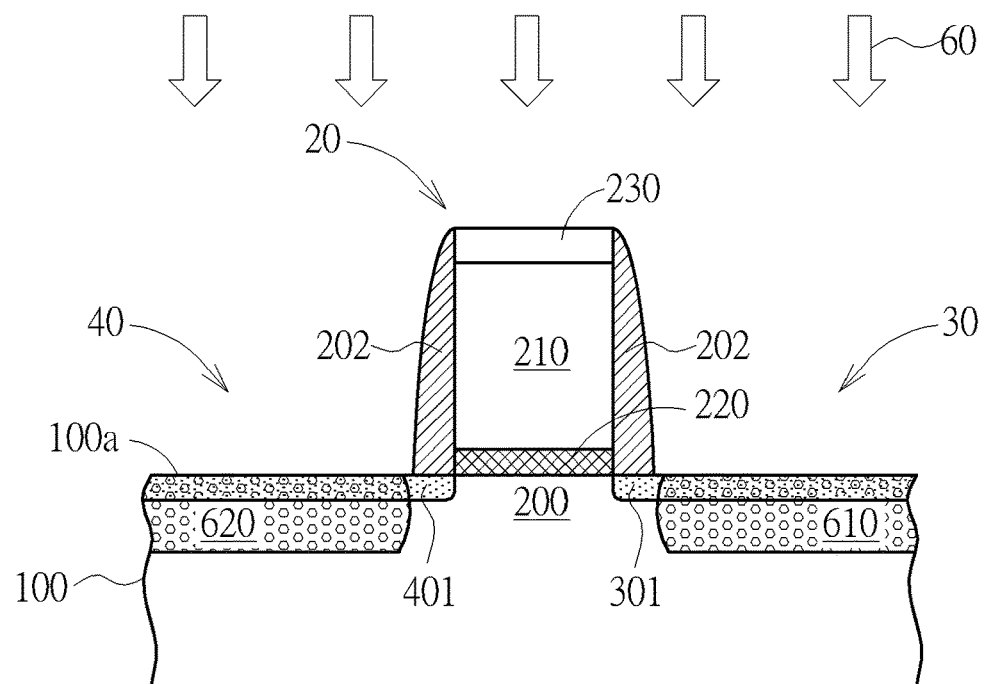

Subsequently, as shown in FIG. 17, an ion implantation process 60 is performed to implant dopants, for example, silicon (Si), germanium (Ge) or xenon (Xe) ions into the substrate 100 in the first region 30 and the second region 40 to amorphize the first region 30 and the second region 40, thereby forming an amorphous silicon layer 610 and an amorphous silicon layer 620 in the first region 30 and the second region 40, respectively.

Figure 18:
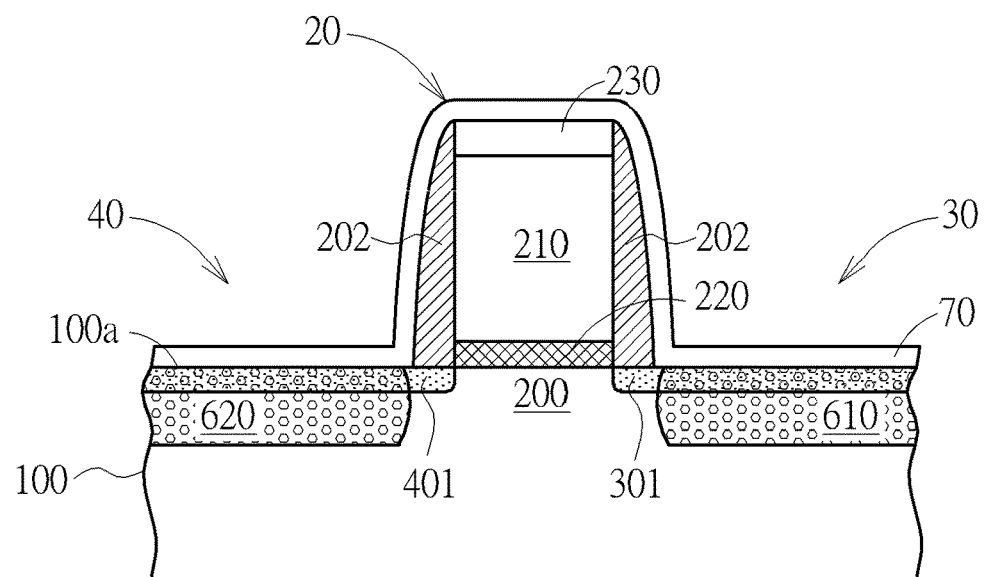
Figure 19:
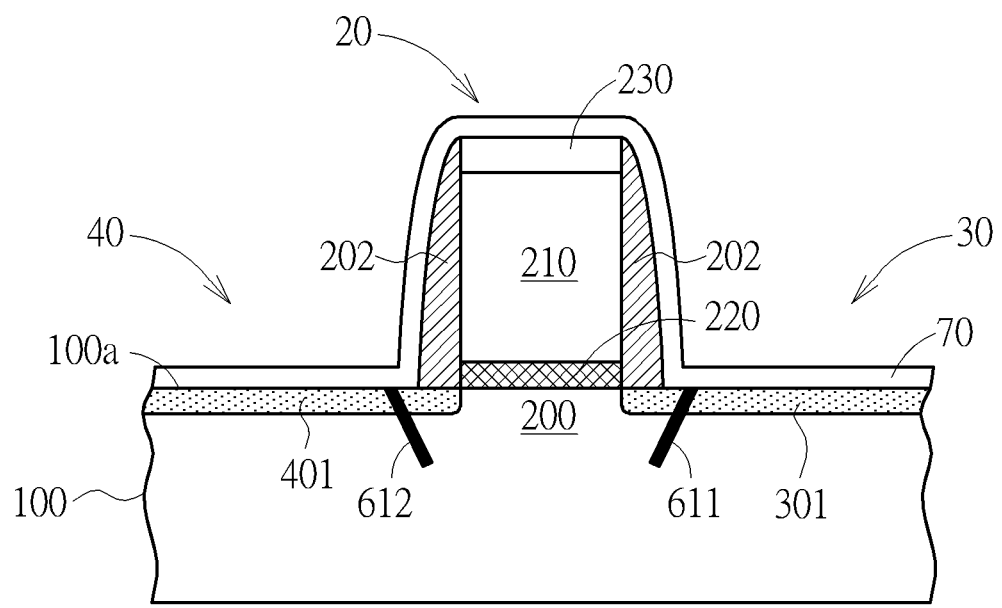

As shown in FIG. 18 and FIG. 19, a stress memorization technique (SMT) process is performed. For example, a stress film 70 is deposited on the substrate 100. The stress film 70 conformally covers the gate structure 20, the spacers 202, the first region 30, the amorphous silicon layer 610 in the first region 30, the second region 40, and the amorphous silicon layer 620 in the second region 40. According to an embodiment of the present invention, the stress film 70 may include a silicon nitride layer, a silicon oxide layer, or a silicon oxynitride layer, but is not limited thereto. According to an embodiment of the invention, the stress film 70 may have a tensile stress.

Subsequently, an annealing process is performed to recrystallize the amorphous layer 610 and the amorphous layer 620, so that a dislocation 611 is formed in the first region 30 and a dislocation 612 is formed in the second region 40, as shown in FIG. 19. According to an embodiment of the present invention, the annealing process may be a two-step annealing process. For example, the temperature of the first-stage annealing is between 400 and 750° C., and the temperature of the second-stage annealing is greater than 900° C.

Figure 20:
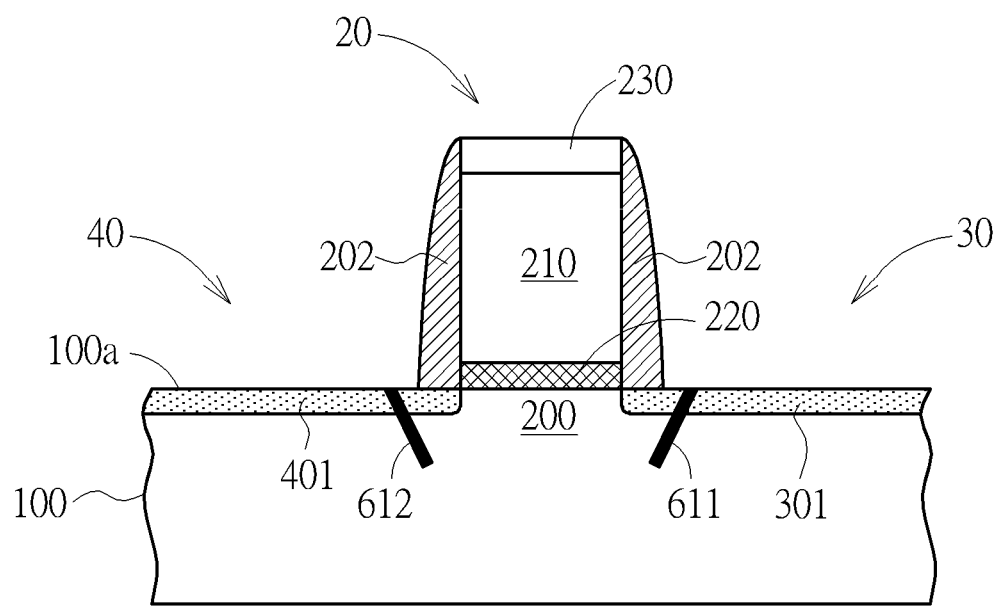

As shown in FIG. 20, the stress film 70 is then removed to reveal the gate structure 20, the spacer 202, the first region 30 and the second region 40. At this point, the dislocations 611, 612 formed in the first region 30 and the second region 40 can provide an appropriate tensile stress to the channel region 200. The steps depicted through FIGS. 6-9 can be repeated such that a plurality of dislocations 611 are formed in the first region 30, as shown in FIG. 21, to increase the source tensile stress.

Finally, ion implantation for forming heavily doped source and the drain may be performed to form a source heavily doped region 302 in the first region 30 and a drain heavily doped region 402 in the second region 40. For example, the source heavily doped region 302 and the drain heavily doped region 402 may be N-type heavily doped regions, thus forming an NMOS field effect transistor 6 having an asymmetric strained source/drain structure.

Figure 21:
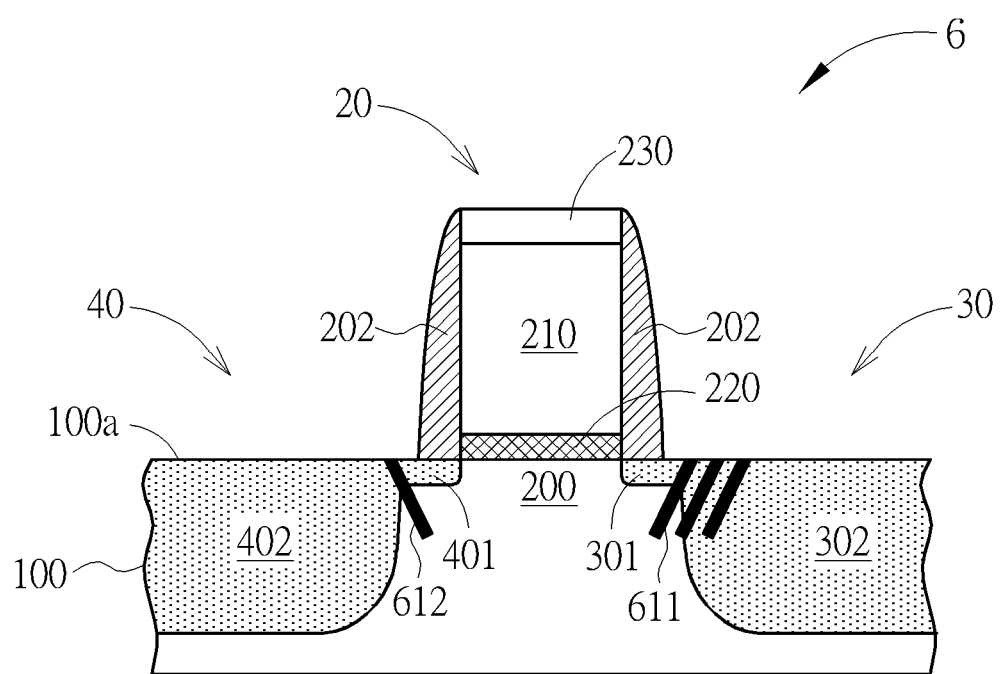

According to an embodiment of the present invention, as shown in FIG. 21, the NMOS transistor structure 6 includes a substrate 100 having an upper surface 100a, a first region 30 disposed in the substrate 100, a second region 40 disposed in the substrate 100 and spaced apart from the first region 30, a channel region 200 between the first region 30 and the second region 40, and a gate structure 20 on the channel region 200. There may be m dislocations 611 in the first region 30, where m is an integer greater than or equal to 1, and there may be n dislocations 612 in the second region 40, where n is an integer greater than or equal to 0, and wherein m is greater than n, such as m=3, n=1. The first region 30 and the second region 40 are both N-type doped regions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having an upper surface;
   a first region in the substrate, wherein the first region comprises a stress-inducing layer;
   a second region in the substrate and spaced apart from the first region;
   a channel region between the first region and the second region;
   a gate structure on the channel region;
   m dislocations in the first region, wherein m is an integer greater than or equal to 1, wherein each of the m dislocations extends from the stress-inducing layer to the substrate below the stress-inducing layer; and
   n dislocations in the second region, wherein n is an integer greater than or equal to 0, and wherein m is greater than n.

2. The semiconductor device according to claim 1, wherein the second region further comprises a stress-inducing layer.

3. The semiconductor device according to claim 2, wherein the stress-inducing layer comprises a SiP layer or a SiC layer.

4. The semiconductor device according to claim 1, wherein the first region and the second region are both an N-type doped region.

5. The semiconductor device according to claim 1, wherein m=3 and n=1.

6. The semiconductor device according to claim 1 further comprising a lightly doped drain region in the first region and the second region, respectively, wherein each of the dislocations is formed through the lightly doped drain region.

* * * * *